(12) United States Patent
Wei et al.

(10) Patent No.: US 11,805,658 B2
(45) Date of Patent: Oct. 31, 2023

(54) MAGNETIC RANDOM ACCESS MEMORY AND MANUFACTURING METHOD THEREOF

(71) Applicant: TAIWAN SEMICONDUCTOR MANUFACTURING COMPANY, LTD., Hsinchu (TW)

(72) Inventors: Hui-Hsien Wei, Taoyuan (TW); Chung-Te Lin, Tainan (TW); Han-Ting Tsai, Kaoshiung (TW); Tai-Yen Peng, Hsinchu (TW); Yu-Teng Dai, New Taipei (TW); Chien-Min Lee, Hsinchu County (TW); Sheng-Chih Lai, Hsinchu County (TW); Wei-Chih Wen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 84 days.

(21) Appl. No.: 17/537,119

(22) Filed: Nov. 29, 2021

(65) Prior Publication Data
US 2022/0085102 A1    Mar. 17, 2022

Related U.S. Application Data

(62) Division of application No. 15/966,639, filed on Apr. 30, 2018, now Pat. No. 11,189,658.
(Continued)

(51) Int. Cl.
*H10B 61/00*    (2023.01)
*G11C 11/16*    (2006.01)
(Continued)

(52) U.S. Cl.
CPC ............ *H10B 61/00* (2023.02); *G11C 11/161* (2013.01); *H01F 41/307* (2013.01); *H10N 50/01* (2023.02);
(Continued)

(58) Field of Classification Search
CPC ....... H10B 61/00; G11C 11/161; G11C 11/15; H10N 50/01; H10N 50/80; H10N 50/85;
(Continued)

(56) References Cited

U.S. PATENT DOCUMENTS

| | | | |
|---|---|---|---|
| 6,040,243 | A | 3/2000 | Li et al. |
| 7,030,034 | B2 | 4/2006 | Fucsko et al. |

(Continued)

FOREIGN PATENT DOCUMENTS

| | | |
|---|---|---|
| CN | 101515566 A | 8/2009 |
| KR | 10-2015-0124534 A | 11/2015 |
| KR | 10-2017-0022061 A | 3/2017 |

OTHER PUBLICATIONS

Perez-Campos et al., PostCMOS compatible sacificial layers for aluminum nitride microcantilevers, J. Mico/Nanolith. MEMS MOEMS 13(4), 043012 (Oct.-Dec. 2014).
(Continued)

*Primary Examiner* — Shih Tsun A Chou
(74) *Attorney, Agent, or Firm* — McDermott Will & Emery LLP

(57) ABSTRACT

In a method of manufacturing a semiconductor device, a magnetic random access memory (MRAM) cell structure is formed. The MRAM cell structure includes a bottom electrode, a magnetic tunnel junction (MTJ) stack and a top electrode. A first insulating cover layer is formed over the MRAM cell structure. A second insulating cover layer is formed over the first insulating cover layer. An interlayer dielectric (ILD) layer is formed. A contact opening in the
(Continued)

ILD layer is formed, thereby exposing the second insulating cover layer. A part of the second insulating cover layer and a part of the first insulating cover layer are removed, thereby exposing the top electrode. A conductive layer is formed in the opening contacting the top electrode.

20 Claims, 17 Drawing Sheets

Related U.S. Application Data

(60) Provisional application No. 62/590,136, filed on Nov. 22, 2017.

(51) Int. Cl.
    *H01F 41/30*     (2006.01)
    *H10N 50/01*     (2023.01)
    *H10N 50/10*     (2023.01)
    *H10N 50/80*     (2023.01)
    *H10N 50/85*     (2023.01)
    *B82Y 25/00*     (2011.01)

(52) U.S. Cl.
    CPC ............ *H10N 50/10* (2023.02); *H10N 50/80* (2023.02); *H10N 50/85* (2023.02); *B82Y 25/00* (2013.01); *H10B 61/22* (2023.02)

(58) Field of Classification Search
    CPC ... B82Y 25/00; H01L 21/76802; H01L 43/08; H01L 43/12; H01L 43/02; H01L 27/228; H01L 27/222
    See application file for complete search history.

(56) References Cited

U.S. PATENT DOCUMENTS

| | | | |
|---|---|---|---|
| 7,723,128 B2 | 5/2010 | Wang et al. | |
| 8,796,042 B2 | 8/2014 | Shin et al. | |
| 8,912,012 B2 | 12/2014 | Li et al. | |
| 9,343,659 B1 | 5/2016 | Lu et al. | |
| 2009/0209050 A1* | 8/2009 | Wang | H01L 43/12 |
| | | | 257/E21.001 |
| 2010/0009533 A1 | 1/2010 | Shaviv et al. | |
| 2010/0102407 A1* | 4/2010 | Kajiyama | H01L 43/08 |
| | | | 257/E29.323 |
| 2011/0115094 A1 | 5/2011 | Darnon et al. | |
| 2012/0293209 A1 | 11/2012 | Takewaki | |
| 2013/0015541 A1 | 1/2013 | Kanaya | |
| 2013/0032775 A1 | 2/2013 | Satoh et al. | |
| 2013/0058162 A1 | 3/2013 | Yamanaka et al. | |
| 2013/0075838 A1 | 3/2013 | Chen et al. | |
| 2014/0028659 A1 | 1/2014 | Yamazaki et al. | |
| 2014/0087483 A1 | 3/2014 | Ohsawa et al. | |
| 2014/0264668 A1 | 9/2014 | Lee et al. | |
| 2015/0035031 A1 | 2/2015 | Kim | |
| 2015/0069559 A1 | 3/2015 | Tsubata et al. | |
| 2015/0093899 A1 | 4/2015 | Huang et al. | |
| 2015/0214068 A1 | 7/2015 | Chen et al. | |
| 2015/0263270 A1 | 9/2015 | Kitagawa et al. | |
| 2015/0311253 A1 | 10/2015 | Choi et al. | |
| 2017/0054070 A1 | 2/2017 | Bak et al. | |
| 2017/0092847 A1 | 3/2017 | Kim et al. | |
| 2017/0140924 A1 | 5/2017 | Suzuki et al. | |
| 2017/0309514 A1 | 10/2017 | Rainville et al. | |
| 2018/0212140 A1 | 7/2018 | Noh | |

OTHER PUBLICATIONS

Indium Corporation, Chemical Vapol Deposition vs. Physical Vapol Deposition, Application Note, 2008.

Katamreddy et al., ALD and Characterization of Aluminum Oxide Deposited on Si (100) using Tris(diethylamino) Aluminum and Water Vapor, Journal of the Electrochemical Society, 153(10) C701-C706 (2006).

Non-Final Office Action issued in U.S. Appl. No. 15/966,639, dated May 31, 2019.

Final Office Action issued in U.S. Appl. No. 15/966,639, dated Nov. 29, 2019.

Non-Final Office Action issued in U.S. Appl. No. 15/966,639, dated Oct. 8, 2020.

Final Office Action issued in U.S. Appl. No. 15/966,639, dated Feb. 4, 2021.

Notice of Allowance issued in U.S. Appl. No. 15/966,639, dated Jul. 27, 2021.

\* cited by examiner

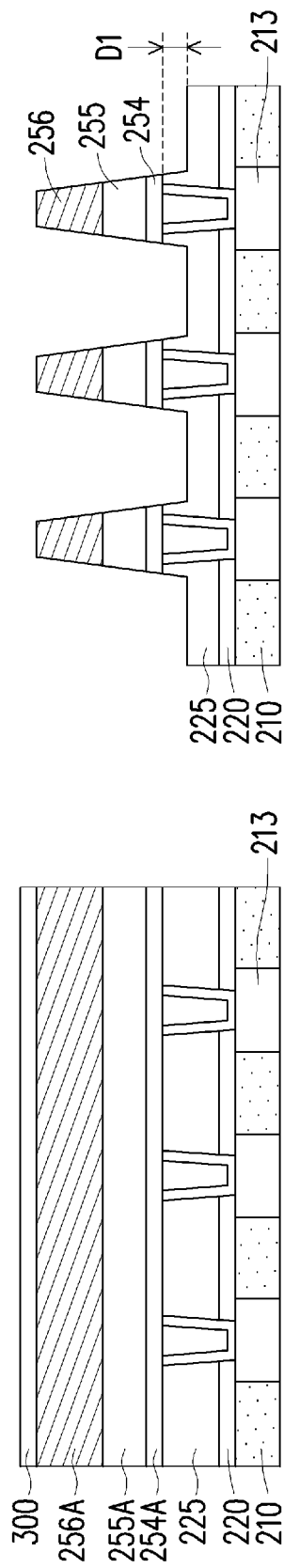

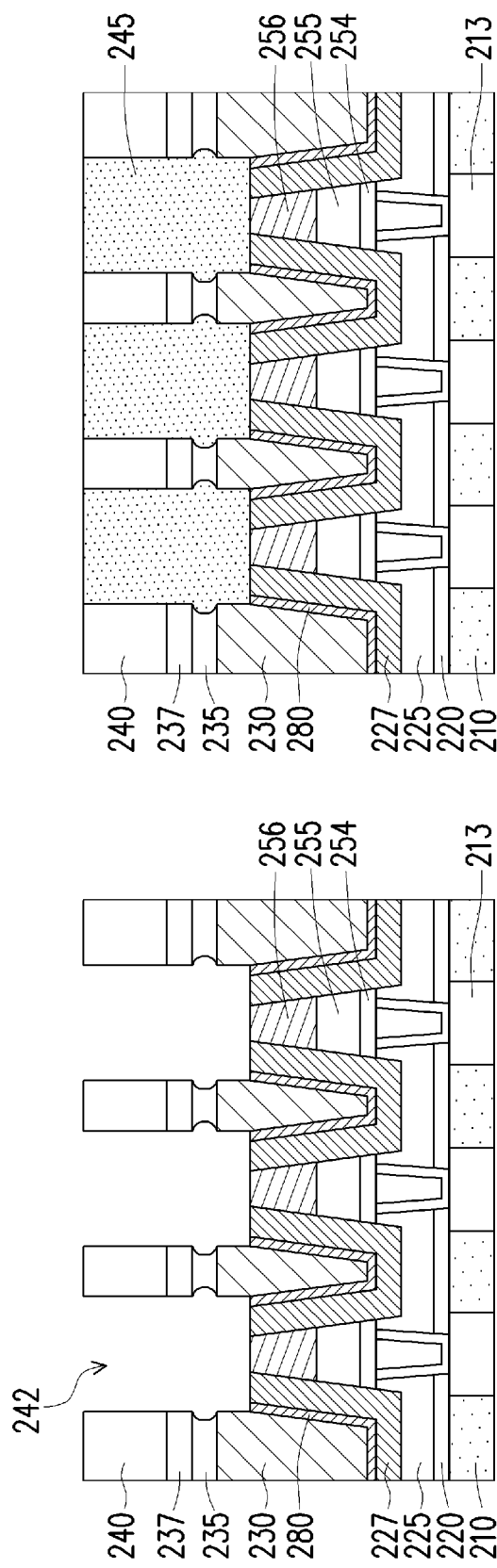

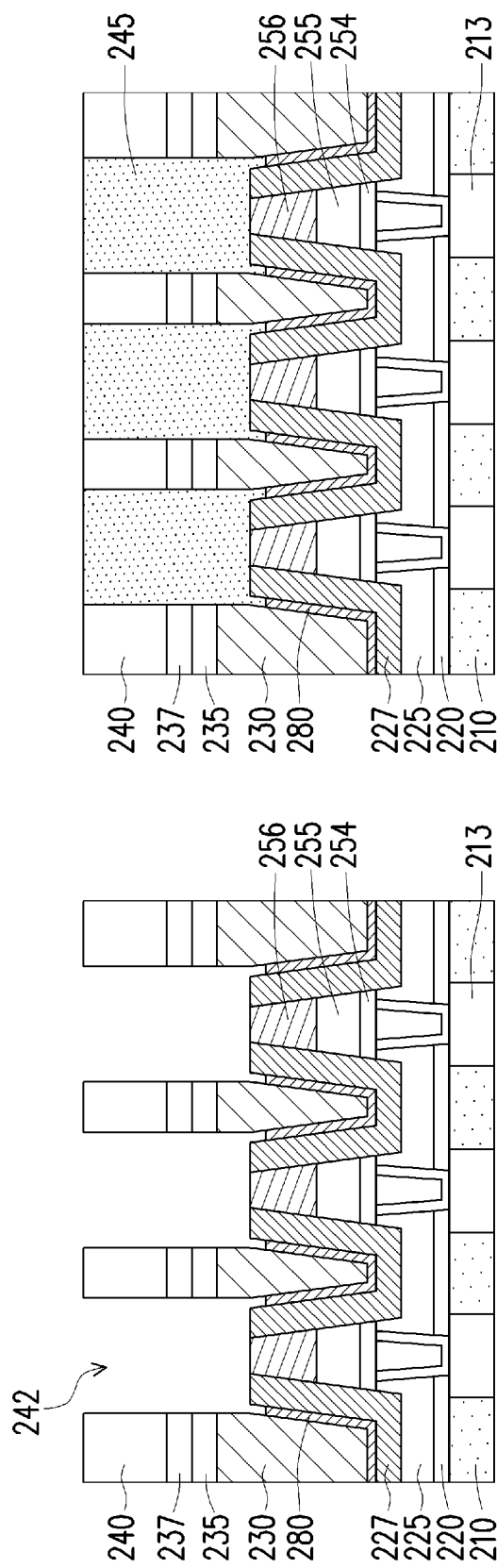

MAGNETIC RANDOM ACCESS MEMORY AND MANUFACTURING METHOD THEREOF

RELATED APPLICATIONS

This application is a divisional of U.S. patent application Ser. No. 15/966,639 filed Apr. 30, 2018, now U.S. Pat. No. 11,189,658, which claims priority to U.S. Provisional Application No. 62/590,136 filed on Nov. 22, 2017, the entire contents of each of which are incorporated herein by reference.

TECHNICAL FIELD

The present disclosure relates to a magnetic random access memory (MRAM) device and, more particularly, to an MRAM device based on a magnetic tunnel junction cell formed with a semiconductor device.

BACKGROUND

An MRAM offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

BRIEF DESCRIPTION OF THE DRAWINGS

FIGS. 7A and 7B show various stages of a sequential manufacturing process of the semiconductor device including an MRAM according to an embodiment of the present disclosure.

FIGS. 11E and 11F show various stages of a sequential manufacturing process of the semiconductor device including an MRAM according to another embodiment of the present disclosure.

FIGS. 14A and 14B show various stages of a sequential manufacturing process of the semiconductor device including an MRAM according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

Figure 1B:
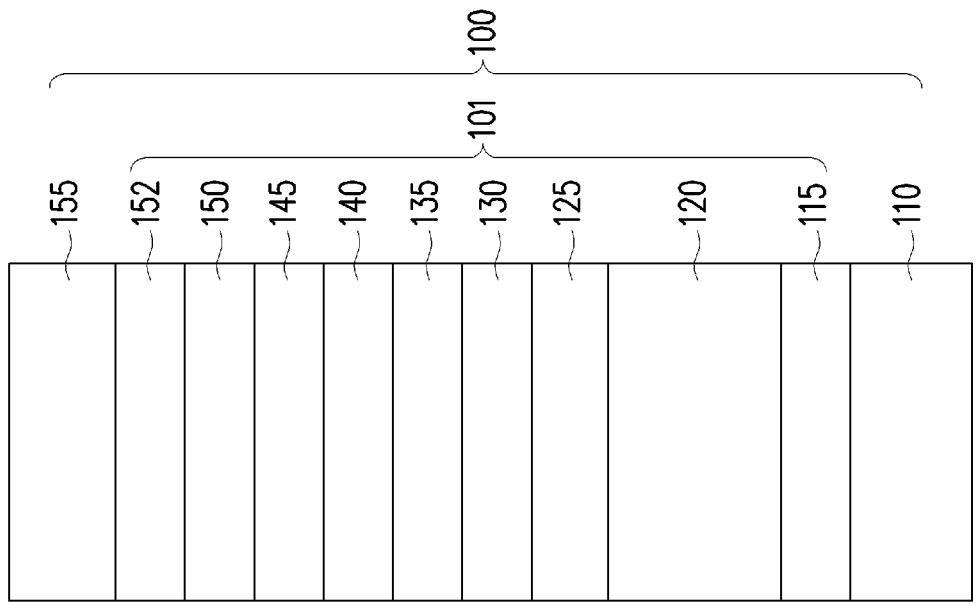
FIG. 1B is a schematic cross sectional view of the MTJ film stack according to an embodiment of the present disclosure.
Figure 1A:
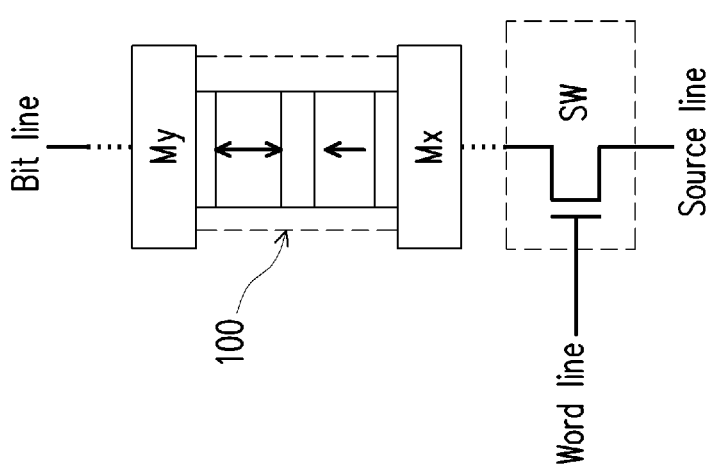
FIG. 1A is a schematic view of an MTJ MRAM cell according to an embodiment of the present disclosure.

FIG. 1A is a schematic view of a MTJ MRAM cell according to an embodiment of the present disclosure, and FIG. 1B is a schematic cross sectional view of the MTJ film stack. The MTJ film stack 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. The upper metal layer My is coupled to a bit line. In some embodiments, the switching device SW is disposed between the upper metal layer My and the bit line.

The MTJ film stack 100 shown in FIG. 1B includes a first electrode layer 110 coupled to the lower metal layer Mx and a second electrode layer 155 coupled to the upper metal layer My. An MTJ functional layer 101 is disposed between the first electrode layer 110 and the second electrode layer 155.

The MTJ functional layer 101 includes a second pinned magnetic layer 130, a free magnetic layer 140, and a tunneling barrier layer 135 made of a non-magnetic material and disposed between the second pinned magnetic layer 130 and the free magnetic layer 140. The free magnetic layer 140 and the second pinned magnetic layer 130 include one or more ferromagnetic materials that can be magnetically oriented, respectively. The second pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the second pinned magnetic layer 130 at low potentials and capable of conducting current through electron tunneling at higher potentials. In some embodiments, the tunneling barrier layer 135 includes magnesium oxide (MgO) having a thickness in a range from about 0.5 nm to about 1.2 nm.

The MTJ functional layer 101 further includes an antiferromagnetic layer 125, as shown in FIG. 1B. The antiferromagnetic layer 125 is used to fix the magnetic orientation of the second pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ functional layer 101 further includes a first pinned magnetic layer 120 and a second pinned magnetic layer 130 both including one or more magnetic materials, as shown in FIG. 1B.

The first electrode layer 110 is formed on the lower metal layer Mx made of, for example, Cu, Al, W, Co, Ni, and/or an alloy thereof, and the upper metal layer My made of, for example, Cu, Al, W, Co, Ni, and/or an alloy thereof, is formed on the second electrode layer 155.

Figure 2A:
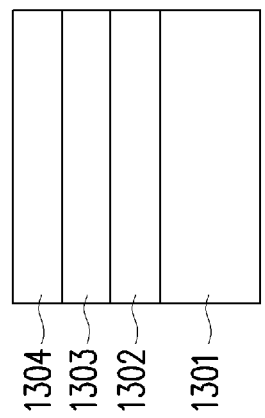
FIGS. 2A, 2B and 2C show schematic cross sectional views of magnetic layers of the MTJ film stack according to an embodiment of the present disclosure.

The second pinned magnetic layer 130 includes multiple layers of magnetic materials. In some embodiments, as shown in FIG. 2A, the second pinned magnetic layer 130 includes four layers 1301, 1302, 1303 and 1304, where the layer 1304 is in contact with the tunneling barrier layer 135 and the layer 1301 is in contact with the antiferromagnetic layer 125. In some embodiments, the layer 1301 (the bottommost layer) includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1301 is in a range from about 2.0 nm to about 5.0 nm in some embodiments. The layer 1302 includes a cobalt layer having a thickness in a range from about 0.4 nm to about 0.6 nm. In certain embodiments, the layer 1301 includes the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments. The layer 1304 includes a cobalt iron boron (CoFeB) layer, a cobalt/palladium (CoPd) layer and/or a cobalt iron (CoFe) layer.

The thickness of the layer 1304 is in a range from about 0.8 nm to about 1.5 nm in some embodiments.

Figure 2B:
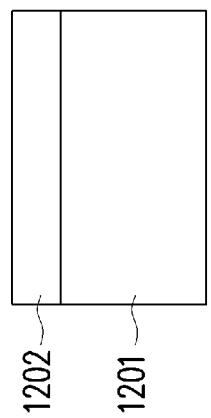

The first pinned magnetic layer 120 includes multiple layers of magnetic materials. In some embodiments, as shown in FIG. 2B, the first pinned magnetic layer 120 includes two layers 1201 and 1202, where the layer 1202 is in contact with the antiferromagnetic layer 125. In some embodiments, the layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the layer 1201 is in a range from about 5.0 nm to about 10.0 nm in some embodiments. The layer 1202 includes a cobalt layer having a thickness in a range from about 0.4 nm to about 0.6 nm.

Figure 2C:
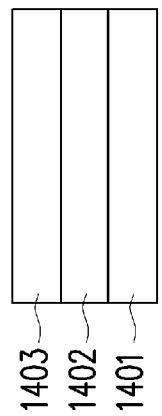

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the layer 1401 is in contact with the tunneling barrier layer 135. The layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The layer 1402 is a spacer layer. The thickness of the spacer layer 1402 is in a range from about 0.2 nm to about 0.6 nm in some embodiments.

The MTJ functional layer 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 includes a dielectric material, such as magnesium oxide or aluminum oxide, and has a thickness in a range from about 0.5 nm to about 1.5 nm in some embodiments. The first electrode layer 110 includes a conductive material, such as a metal (e.g., Ta, Mo, Co, Pt, Ni), to reduce the resistance of the first pinned magnetic layer 120, especially for programming. The second electrode layer 155 also includes a conductive material, such as a metal, to reduce the resistivity during reading.

The pinned magnetic layer, the free magnetic layer and the antiferromagnetic layer can also be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes further comprising low pressure CVD (LPCVD), ultrahigh vacuum CVD (UHVCVD), reduced pressure CVD (RPCVD), or any combinations thereof, or any other suitable film deposition method. The tunneling barrier layer and the diffusion barrier layer can also be formed by CVD, PVD or ALD or any other suitable film deposition method.

FIGS. 3A-3D show a memory operation of MTJ cell. As shown in FIGS. 3A-3D, the MTJ cell includes a pinned magnetic layer 10, a tunneling barrier layer 15 and a free magnetic layer 20. The pinned magnetic layer 10 corresponds to the second pinned magnetic layer 130 or the combination of the first pinned magnetic layer 120, the antiferromagnetic layer 125 and the second pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series.

Figure 3A:
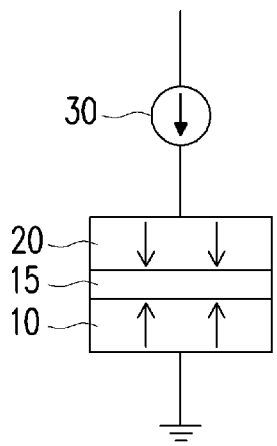
FIGS. 3A and 3B show operations of the MTJ film stack.
Figure 3B:
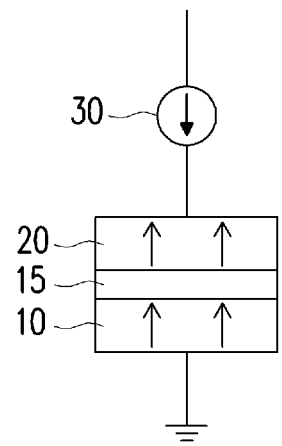
Figure 3C:
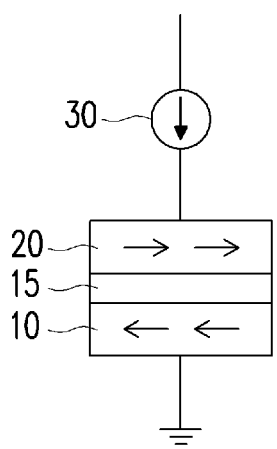
FIGS. 3C and 3D show operations of the MTJ film stack.
Figure 3D:
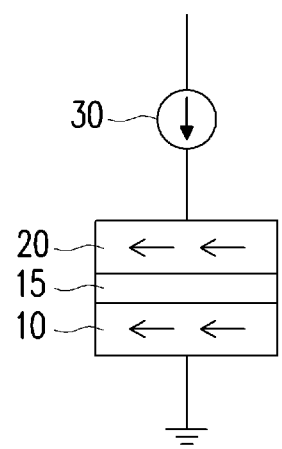

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V_2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in a MTJ cell and retrieved based on the cell orientation and resulting resistance. Further, since the stored data does not require a storage energy source, the cell is non-volatile.

Figure 4A:
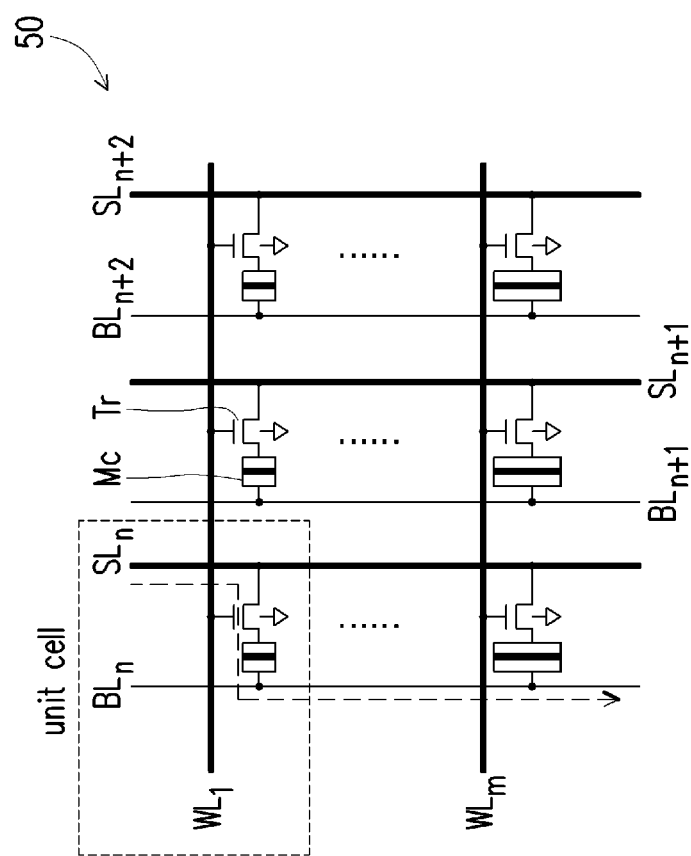
FIG. 4A shows a schematic circuit diagram of an MTJ MRAM.

FIG. 4A shows a schematic circuit diagram of an MTJ MRAM array 50. Each memory cell includes a MTJ cell Mc and a transistor Tr, such as a MOS FET. The gate of the transistor Tr is coupled to one of word lines $WL_1 \ldots WL_m$ and a drain (or a source) of the transistor Tr is coupled to one end of the MTJ cell Mc, and another end of the MTJ cell is coupled to one of bit lines $BL_n$, $BL_{n+1}$ and $BL_{n+2}$. Further, in some embodiments, signal lines (not shown) for programming are provided adjacent to the MTJ cells.

A memory cell is read by asserting the word line of that cell, forcing a reading current through the bit line of that cell, and then measuring the voltage on that bit line. For example, to read the state of a target MTJ cell, the word line is asserted to turn ON the transistor Tr. The free magnetic layer of the target MTJ cell is thereby coupled to one of the fixed potential lines $SL_n$, $SL_{n+1}$ and $SL_{n+2}$, e.g., the ground, through the transistor Tr. Next, the reading current is forced on the bit line. Since only the given reading transistor Tr is turned ON, the reading current flows through the target MTJ cell to the ground. The voltage of the bit line then measured to determine the state ("0" or "1") of the target MTJ cell. In some embodiments, as shown in FIG. 4A, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

Figure 4B:
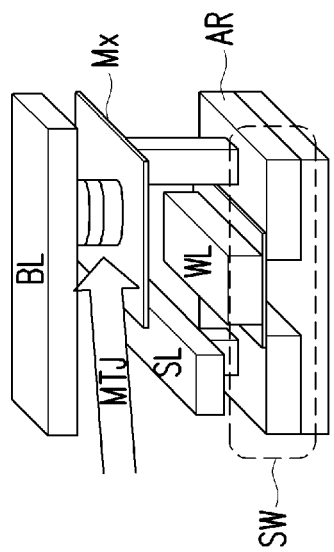
FIG. 4B shows a schematic perspective view of a memory cell of the MTJ MRAM and FIG. 4C shows a memory cell layout of the MTJ MRAM.
Figure 4C:
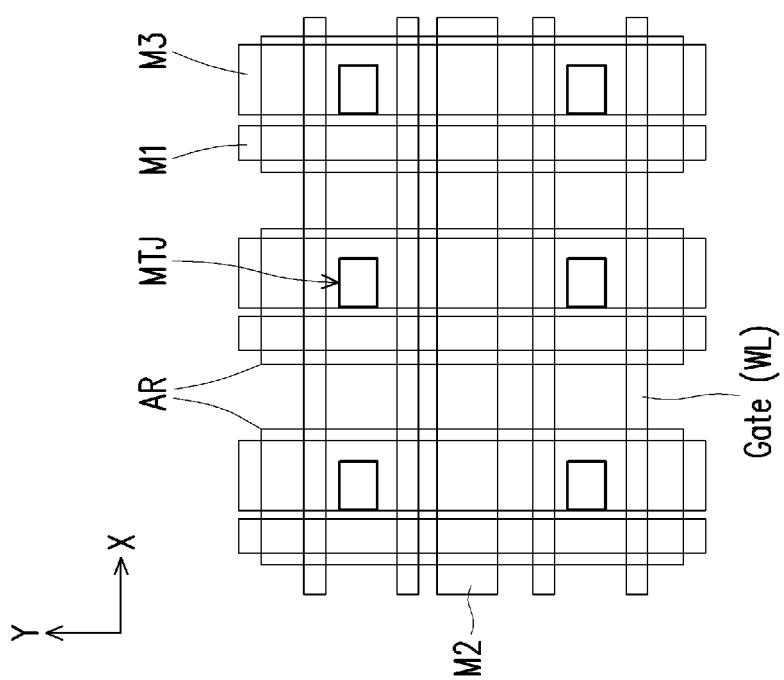

FIG. 4B shows a schematic perspective view of a memory cell of the MTJ MRAM and FIG. 4C shows a memory cell layout of the MTJ MRAM.

As shown in FIGS. 4B and 4C, the MTJ cell MTJ is disposed above a switching device SW, such as a MOS FET. The gate Gate of the MOSFET is a word line WL or coupled to a word line formed by a metal layer. The bottom electrode Mx of the MTJ cell is coupled to a drain of the MOS FET formed in an active region AR and a source of the MOS FET formed in the active region AR is coupled to the source line SL. The upper electrode of the MTJ cell is coupled to a bit line BL. In some embodiments, the source line SL can be formed by metal layers M1 and M2, and the bit line BL can be formed by a metal layer M3. In certain embodiments, one of more metal wirings is a single device layer, and in other embodiments, one or more metal wirings are double or more device layers.

Figure 5:
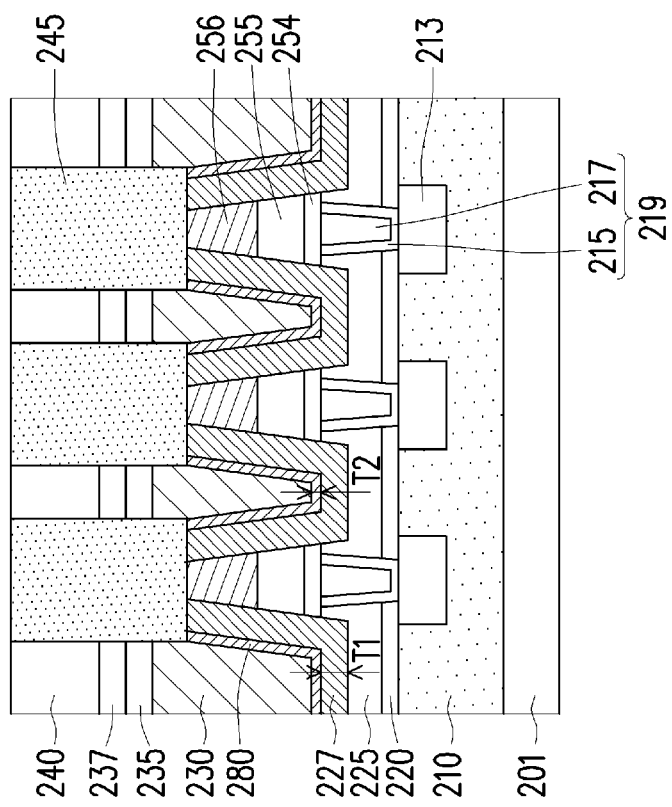
FIG. 5 shows a cross sectional view of a semiconductor device including an MRAM according to an embodiment of the present disclosure.

FIG. 5 shows a cross sectional view of a MTJ MRAM according to an embodiment of the present disclosure. Material, configuration, dimensions and/or processes the same as or similar to the foregoing embodiments described with FIGS. 1A-4C may be employed in the following embodiments, and detailed explanation thereof may be omitted.

As shown in FIG. 5, the MTJ cells of an MRAM are disposed over a substrate 201. In some embodiments, the substrate 201 includes a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 210 is disposed over the substrate 201 to cover the electronic devices. The first ILD layer 210 may be referred to as an inter-metal dielectric (IMD) layer. The first ILD layer 210 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 210 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 213 is formed by, for example, a damascene process. The lower metal wiring 213 includes one or more layers of conductive material, such as Cu, a Cu alloy, Al or any other suitable conductive materials. Each of the MTJ cells is disposed over the lower metal wiring 215, as shown in FIG. 5. Although FIG. 5 shows three MTJ cells, the number of the MTJ cells is not limited to three.

As shown in FIG. 5, a first insulating layer as an etch stop layer 220 is formed on the first ILD layer 210. In some embodiments, the first insulating layer 220 includes a material different from the first ILD layer 210 and includes silicon carbide, silicon nitride, aluminum oxide or any other suitable material. The thickness of the first insulating layer 220 is in a range from about 10 nm to about 25 nm in some embodiments.

A second ILD layer 225 is formed over the first insulating layer 220. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210 and the material for the second ILD layer 225 are the same. In other embodiments, different dielectric materials are used for the first ILD layer 210 and the second ILD layer 225.

A via contact 219 is formed in contact with the lower metal wiring 215 and passing through the second ILD layer 225 and the first etch stop layer 220 in some embodiments. In some embodiments, the via contact 219 includes a liner layer 215 and a body layer 217. The liner layer 215 includes one or more layers of Ti, TiN, Ta or TaN, or other suitable material, and the body layer 217 includes one or more layers of W, Cu, Al, Mo, Co, Pt, Ni, and/or an alloy thereof or other suitable material, in some embodiments.

An MRAM cell includes a bottom electrode 254, an MTJ film stack 255 and a top electrode 256, as shown in FIG. 5. The bottom electrode 254, the MTJ film stack 110 and the top electrode 256 correspond to the first electrode 110, the MTJ functional layer 101 and the second electrode 155 of FIG. 1B. The MRAM cell structure has a tapered shape as shown in FIG. 5. The width of the MRAM cell structure at the bottom (the bottom electrode 254) is greater than the width at the top (the top electrode 256). The thickness of the bottom electrode 254 is in a range from about 5 nm to about 20 nm in some embodiments. The thickness of the MTJ film stack 255 is in a range from about 15 nm to about 50 nm in some embodiments.

In some embodiments, a first insulating cover layer 227 as a sidewall spacer layer is formed on opposing side walls of the MRAM cell structure. The first insulating cover layer 227 includes one or more layers of insulating material. In some embodiments, a nitride-based insulating material is used. In certain embodiments, the nitride-based insulating material is a silicon nitride-based insulating material, such as SiON, SiON, SiCN and SiOCN. The thickness T1 of the first insulating cover layer 227 is in a range from about 5 nm to about 30 nm in some embodiments, and is in a range from about 10 nm to about 20 nm in other embodiments.

Further, a second insulating cover layer 280 is formed over the first insulating cover layer 227. The second insulating cover layer 280 includes one or more layers of insulating material different from the first insulating cover layer 227. In some embodiments, an aluminum-based insulating material is used. In certain embodiments, the aluminum-based insulating material includes aluminum oxide, aluminum nitride, aluminum oxynitride, aluminum carbide and/or aluminum oxycarbide. In some embodiments, the concentrations of Al, O, C and/or N in the thickness direction are not uniform. In certain embodiments, the concentration of Al gradually decreases from the bottom to the top of the second insulating cover layer 280, while the concentrations of O, C and/or N gradually increase from the bottom to the top of the second insulating cover layer 280. The thickness T2 of the second insulating cover layer 270 is smaller than the thickness T1 of the first insulating cover layer in some embodiments. The thickness T2 is in a range from about 1 nm to about 10 nm in some embodiments, and is in a range from about 3 nm to about 5 nm in other embodiments.

Further a third ILD layer 230 is disposed in spaces between the MRAM cell structures. The third ILD layer 230 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210, the material for the second ILD layer 225 and the material for the third ILD layer 230 are the same. In other embodiments, at least two of them are made of different dielectric materials.

Further, a fourth ILD layer is disposed over the third ILD layer 230. In some embodiments, the fourth ILD layer is a multiple layer structure and includes a first dielectric layer 235 as an etch stop layer formed on the third ILD layer 230, a second dielectric layer 237 formed on the first dielectric layer 235 and a third dielectric layer 240 formed on the second dielectric layer. In other embodiments, the fourth ILD layer is a two-layer structure without one of the first or second dielectric layers.

In some embodiments, the first dielectric layer 235 and second dielectric layer 237 are made of different material than the third dielectric layer 240 and include one or more layers of SiN ($Si_3N_4$), SiON, SiOCN, SiCN, SiC or any other suitable material. In some embodiments, the first dielectric layer 235 and second dielectric layer 237 are made of different materials from each other.

The third dielectric layer 240 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the material for the first ILD layer 210, the material for the second ILD layer 225, the material for the third ILD layer 230 and the material for the third dielectric layer 240 are the same. In other embodiments, at least two of them are made of different dielectric materials. The thickness of the third dielectric layer 240 is greater than the thicknesses of the first and second dielectric layers 235 and 237 in some embodiments.

A conductive contact 245 is formed in contact with the top electrode 256, as shown in FIG. 5. The conductive contact 245 is the same as or similar to the lower metal wiring 213 and/or the via contact 219 and is made of, for example, Cu, Al, Ta, Ti, Mo, Co, Pt, Ni, W, TiN and/or TaN and/or an alloy thereof or other suitable material.

As shown in FIG. 5, the upper surface of the top electrode 256 is substantially flush with the upper surfaces of the first insulating cover layer 227 and/or the second insulating cover layer 280 in some embodiments.

FIGS. 6A-11F show various stages of a sequential manufacturing process of the semiconductor device including an MRAM according to an embodiment of the present disclosure. It is understood that additional operations can be provided before, during, and after processes shown by FIGS. 6A-11F, and some of the operations described below can be replaced or eliminated, for additional embodiments of the method. Material, configuration, dimensions and/or processes the same as or similar to the foregoing embodiments described with FIGS. 1A-5 may be employed in the following embodiments, and detailed explanation thereof may be omitted.

Figure 6A:
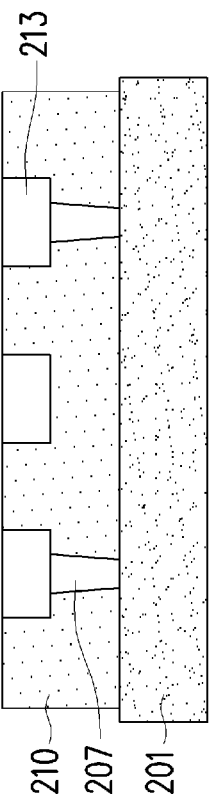
FIGS. 6A, 6B and 6C show various stages of a sequential manufacturing process of the semiconductor device including an MRAM according to an embodiment of the present disclosure.
Figure 6C:
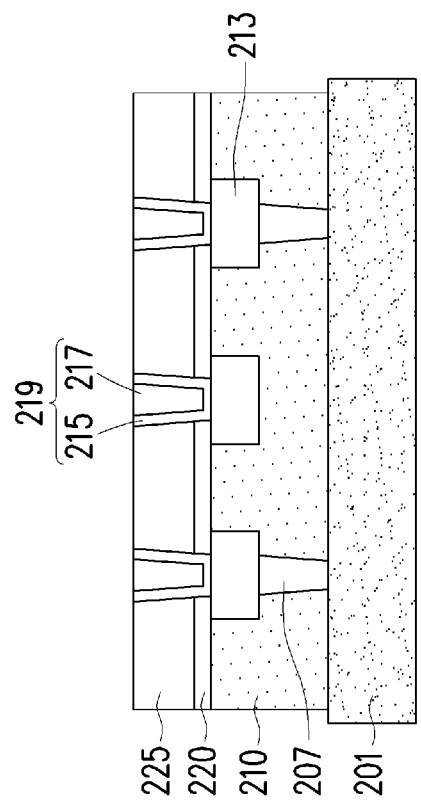
Figure 6B:
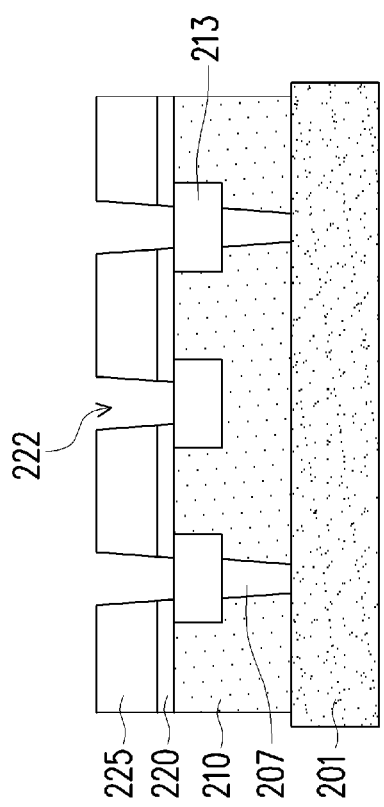

As shown in FIG. 6A, lower metal wirings 213 are formed in the first ILD layer 210 over the substrate 201. In some embodiments, via contacts 207 are provided under the lower metal wirings 213. Then, as shown in FIG. 6B, a first insulating layer as an etch stop layer 220 is formed over the structure of FIG. 6A, and a second ILD layer 225 is formed over the first insulating layer 220. Further, as shown in FIG. 6B, via contact openings 222 are formed to expose the upper surface of the lower metal wirings 213, by using one or more lithography and etching operations. Subsequently, via contact 219 including layers 215 and 217 are formed, as shown in FIG. 6C. One or more film forming operations, such as CVD, PVD including sputtering, ALD, electro-chemical plating and/or electro-plating, are performed, and a planarization operation, such as CMP, is performed to fabricate the via contacts 219.

Then, as shown in FIG. 7A, a first conductive layer 254A for the bottom electrode 254, a stacked layer 255A for the MTJ film stack 255 and a second conductive layer 256A for the top electrode 256 are sequentially formed. In some embodiments, a layer 300 for a hard mask is further formed on the second conductive layer 256A.

By using one or more lithography and etching operations, the film stack shown in FIG. 7A is patterned into an MRAM cell structure including the bottom electrode 254, the MTJ film stack 255 and the top electrode 256, as shown in FIG. 7B. In some embodiments, after the patterning the second conductive layer 256A, the stacked layer 255A and the first conductive layer 256A, the second ILD layer 225 is partially recessed. The amount D1 of the recess is in a range from about 1 nm to about 30 nm in some embodiments.

Figure 8A:
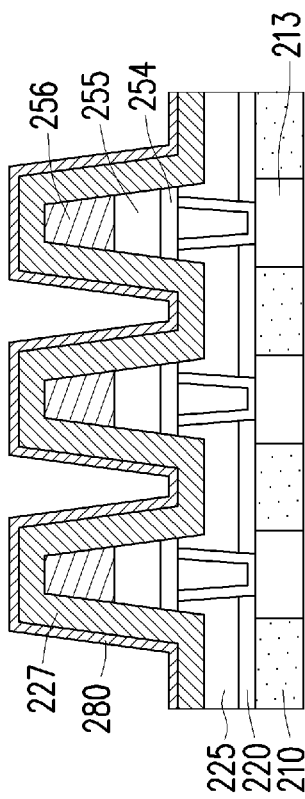
FIGS. 8A and 8B show various stages of a sequential manufacturing process of the semiconductor device including an MRAM according to an embodiment of the present disclosure.

Subsequently, as shown in FIG. 8A, a first insulating cover layer 227 is formed to cover the MRAM cell structure. The first insulating cover layer 227 can be formed by CVD, PVD or ALD or any other suitable film deposition method. In some embodiments, the first insulating cover layer 227 is formed by CVD, PVD or ALD at a lower temperature range less than about 150° C., such as a range from about 100° C. to about 150° C. When the first insulating cover layer 227 is formed at a higher temperature, such as a range from about 200° C. to about 300° C. (or more), the film formation process may cause damage to the MTJ film stack 255 since the first insulating cover layer is directly formed on the MTJ film stack 255. As shown in FIG. 8A, the first insulating cover layer 227 is conformally formed.

Figure 8B:
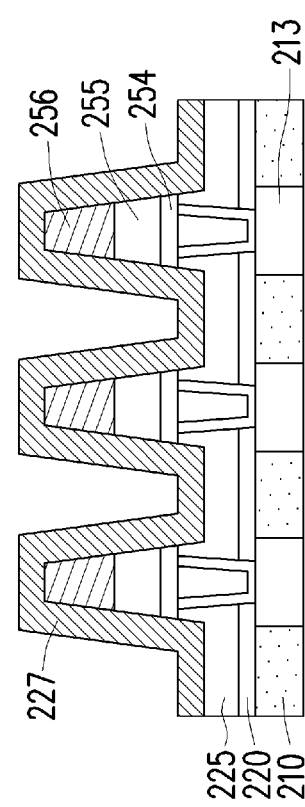

Then, as shown in FIG. 8B, a second insulating cover layer 280 is formed to cover the MRAM cell structure. The second insulating cover layer 280 can be formed by CVD, PVD or ALD or any other suitable film deposition method. As shown in FIG. 8B, the second insulating cover layer 280 is conformally formed. As set forth above, the second insulating cover layer 280 includes an aluminum-based insulating material in some embodiments. The aluminum-based insulating material, such as AlO ($Al_2O_3$), AlN, AlC, AlOC and AlON, can be formed by the following operations. First, an aluminum layer is formed on the first insulating cover 227. The aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlN, AlC, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC, AlC, and/or AlON layer can be directly formed by CVD, PVD or ALD or other suitable method by using appropriate source gases. In some embodiments, the second insulating cover layer 280 is formed by CVD, PVD or ALD at a temperature range in a range from about 300° C. to about 450° C. Although lower forming temperature (e.g., less than 300° C.) may be employed, since there is the first insulating cover layer 227 is formed to cover the MTJ film stack 255, a higher forming temperature (about 300° C. to about 450° C.) may not damage the MTJ film stack 255.

Figures 9A, 9B:
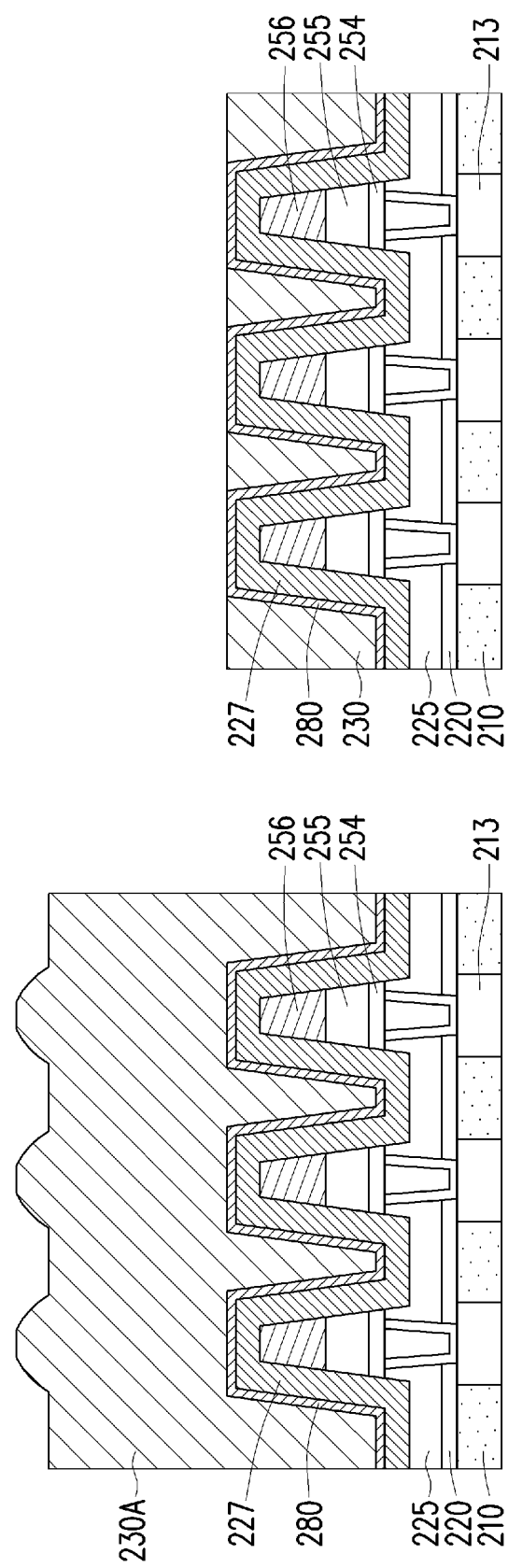
FIGS. 9A and 9B show various stages of a sequential manufacturing process of the semiconductor device including an MRAM according to an embodiment of the present disclosure.

Next, as shown in FIG. 9A, a dielectric material layer 230A for the third ILD layer 230 is formed to fully cover the second insulating cover layer 280. In some embodiments, an etch-back operation is performed on the dielectric material layer 230A, and then a CMP operation is performed, as shown in FIG. 9B. Because the selectivity for the CMP operation between the second insulating cover layer 280 and the third ILD layer 230 is high, the CMP operation can utilize the second insulating cover layer 280 as a stop layer. When the CMP operation stops at the upper surface of the second insulating cover layer 280, it is possible to prevent over-etching of the third ILD layer 230, and thus the upper surface of the second insulating cover layer 280 above the MRAM cell structure is substantially flush with the upper surfaces of the third ILD layer 230 in some embodiments.

Figures 10A, 10B:
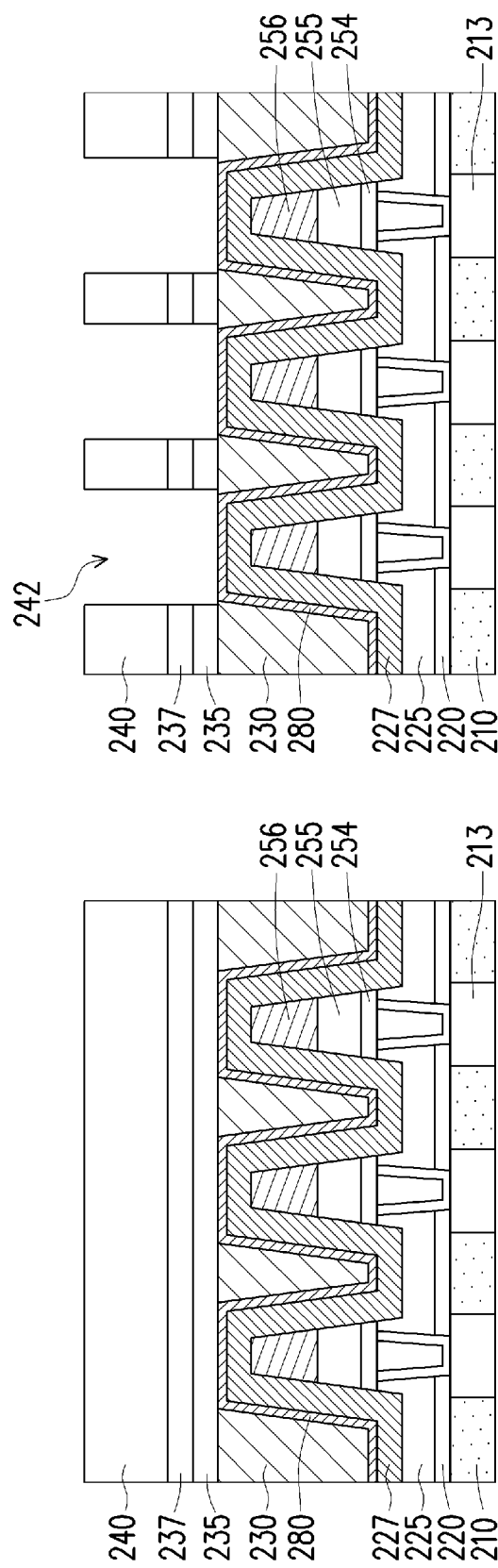
FIGS. 10A and 10B show various stages of a sequential manufacturing process of the semiconductor device including an MRAM according to an embodiment of the present disclosure.

Subsequently, as shown in FIG. 10A, a fourth ILD layer including a first dielectric layer 235, a second dielectric layer 237 and a third dielectric layer 240 is formed over the structure of FIG. 9B. The dielectric layers of the fourth ILD layer can be formed by CVD, PVD or ALD or other suitable film formation method. In some embodiments, the third dielectric layer 240 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Then, as shown in FIG. 10B, contact openings 242 are formed by using one or more lithography and etching operations. Because the selectivity in the etching operation between the second insulating cover layer 280 and the fourth ILD layer is high, the etching operation can utilize the second insulating cover layer 280 as an etch stop layer.

Figures 11A, 11B:
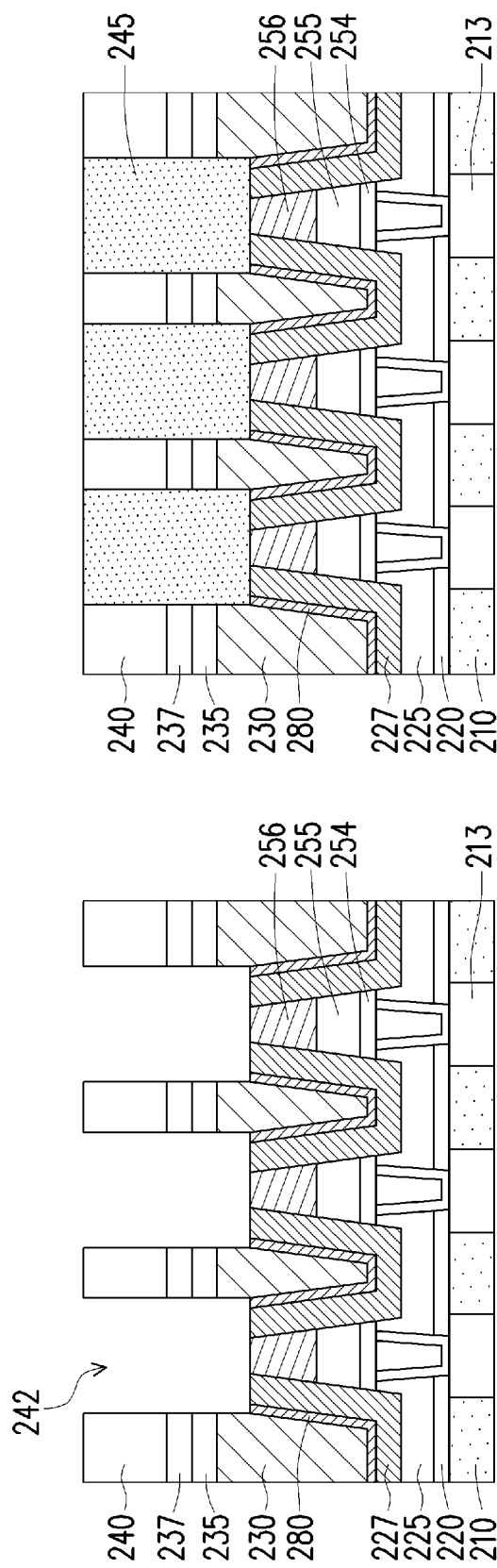
FIGS. 11A and 11B show various stages of a sequential manufacturing process of the semiconductor device including an MRAM according to an embodiment of the present disclosure.

Next, as shown in FIGS. 11A and 11B, a part of the second insulating cover layer 280 and a part of the first insulating cover layer 227 are removed by dry and/or wet etching, thereby exposing the top electrode 256. In some embodiments, part of the second insulating cover layer 280 is removed, and then part of the first insulating cover layer 227 is removed. In some embodiments, one or more wet etching operation is used. In certain embodiments, a wet etching operation is performed to remove the second insulating cover layer 280 and a dry etching operation is performed to remove first insulating cover layer 227. As set forth above, the second insulating cover layer 280 is made at a higher temperature than the first insulating cover layer 227, and thus the second insulating cover layer 280 is a "hard" layer in a dry etching operation. Accordingly, it is advantageous to use a wet etching to remove the second insulating cover layer 280. In contrast, the first insulating cover layer is made at a low temperature and thus is a "soft" layer in a dry etching operation. Thus, a dry etching operation can be utilized to remove the first insulating cover layer 227 with suppressing damage on the top electrode 256. In other embodiments, a wet etching operation is also performed to remove the first insulating cover layer 227. By using wet etching, it is possible to suppress damage to the MTJ film stack 255.

Figure 11D:
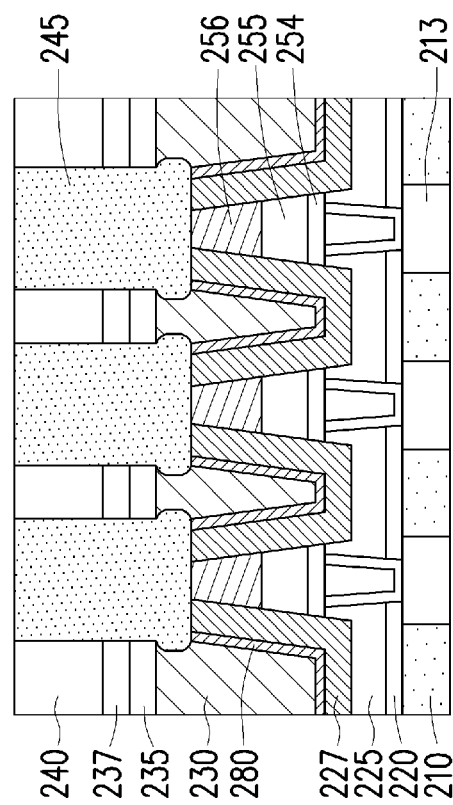
FIGS. 11C and 11D show various stages of a sequential manufacturing process of the semiconductor device including an MRAM according to another embodiment of the present disclosure.
Figure 11C:
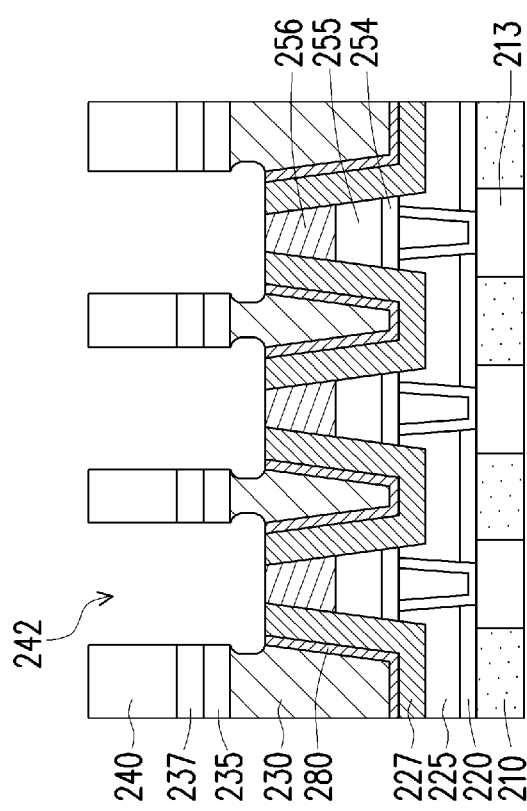

Subsequently, as shown in FIG. 11B, the contact openings 242 are filled with a conductive material so as to form conductive contacts 245 contacting the exposed top electrode 256. In some embodiments, during the etching of the first and/or second insulating cover layers, the third ILD layer 230 and/or the first dielectric layer 235 is/are also slightly laterally etched. When the third ILD layer 230 is laterally etched, as shown in FIG. 11C, the bottom portion of the conductive contact 245 has a broader width than the upper portion as shown in FIG. 11D. In some embodiments, the amount of the lateral etching of the third ILD layer 230 is in a range from about 1 nm to about 2 nm. When the first dielectric layer 235 is laterally etched, as shown in FIG. 11E, the conductive contact 245 has a protrusion on its side faces as shown in FIG. 11E. In some embodiments, the amount of the lateral etching of the first dielectric layer 235 is in a range from about 1 nm to about 2 nm.

It is understood that the device shown in FIG. 11B undergoes further semiconductor processes to form various features such as interconnect metal layers, dielectric layers, passivation layers, etc.

Figure 12A:
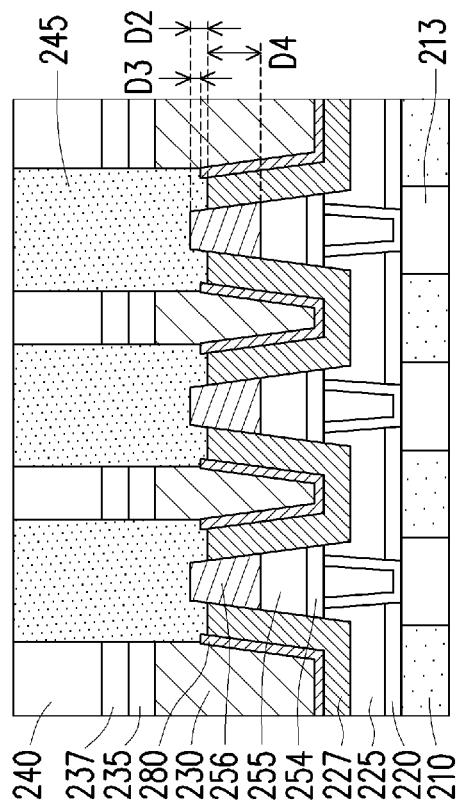
FIGS. 12A and 12B show various stages of a sequential manufacturing process of the semiconductor device including an MRAM according to another embodiment of the present disclosure.
Figure 12B:
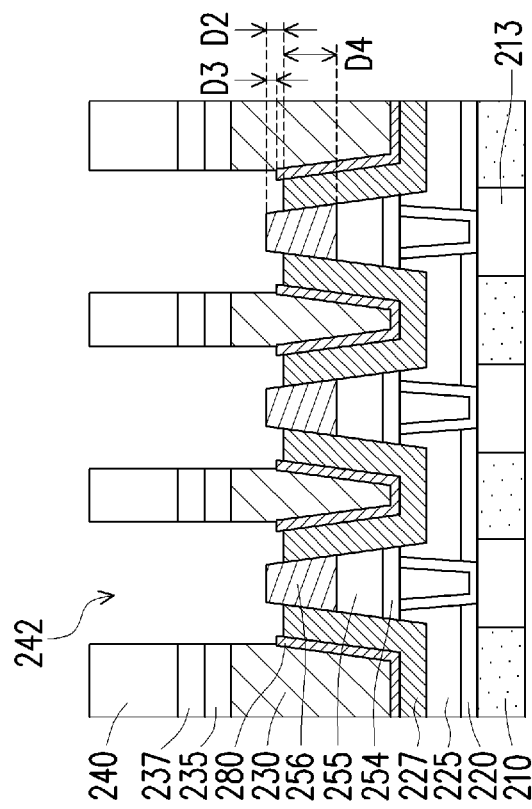

FIGS. 12A and 12B show various stages of a sequential manufacturing process of the semiconductor device including an MRAM according to another embodiment of the present disclosure. Material, configuration, dimensions and/or processes the same as or similar to the foregoing embodiments described with FIGS. 1A-11B may be employed in the following embodiments, and detailed explanation thereof may be omitted.

In FIG. 11A, the upper surface of the top electrode 256 is substantially flush with the upper surfaces of the first insulating cover layer 227 and the second insulating cover layer 280. In the embodiments shown by FIGS. 12A and 12B, the upper surface of the top electrode 256 is not flush with at least one of the upper surfaces of the first insulating cover layer 227 and the second insulating cover layer 280. In some embodiments, the upper surface of the top electrode 256 is higher than the upper surfaces of the first insulating cover layer 227 and the second insulating cover layer 280. This structure can be obtained by over-etching the first insulating cover layer 227 below the upper surface of the top electrode 256. In other words, a vertical level of an upper surface of the top electrode 256 is higher than a vertical level of an upper surface of the first insulating cover layer 227 and a vertical level of an upper surface of the second insulating cover layer 280, measured from the substrate. A difference D2 between the upper surface of the top electrode 256 and the upper surface of the first insulating cover layer 227 is more than 0 nm and less than about 20 nm in some embodiments, and is more than 0 nm and less than about 10 nm in other embodiments. A difference D3 between the upper surface of the top electrode 256 and the upper surface of the second insulating cover layer 280 is more than 0 nm and less than about 10 nm in some embodiments, and is more than 0 nm and less than about 5 nm in other embodiments. In some embodiments, D3 is smaller than D2. In certain embodiments, D3 is equal to or larger than D2. Further, in some embodiments, a difference D4 between the upper surface of the first insulating cover layer 227 and the interface between the MTJ film stack 255 and the top electrode 256 is more than 10 nm in some embodiments, and is more than 20 nm in other embodiments, where D2+D4 is equal to the thickness of the top electrode 256. In other words, sidewalls of the MTJ film stack 255 is fully covered by the first insulating cover layer 227.

Figure 13A:
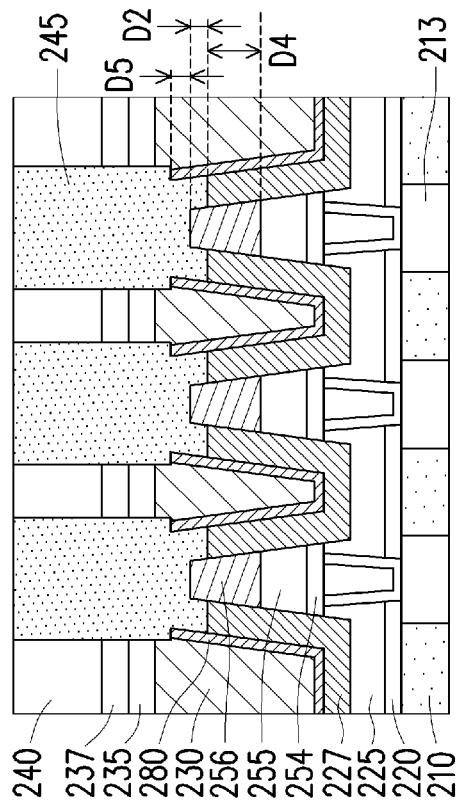
FIGS. 13A and 13B show various stages of a sequential manufacturing process of the semiconductor device including an MRAM according to another embodiment of the present disclosure.
Figure 13B:
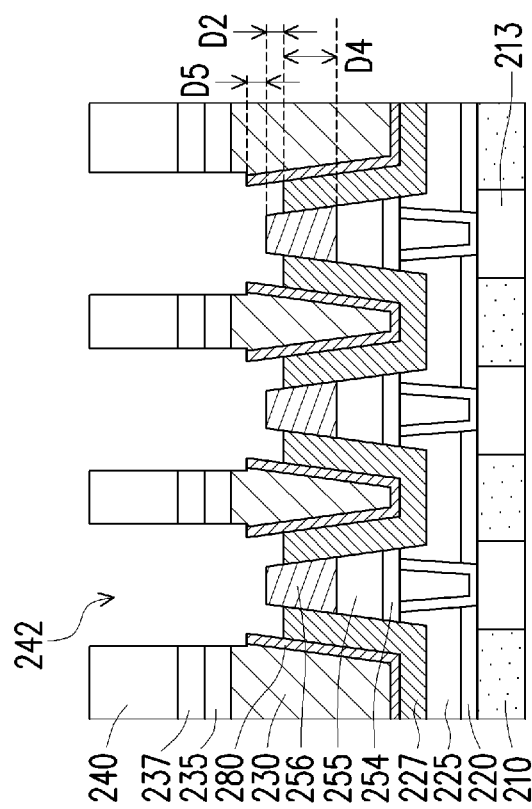

FIGS. 13A and 13B show various stages of a sequential manufacturing process of the semiconductor device including an MRAM according to another embodiment of the present disclosure. Material, configuration, dimensions and/or processes the same as or similar to the foregoing embodiments described with FIGS. 1A-12B may be employed in the following embodiments, and detailed explanation thereof may be omitted.

Similar to FIGS. 12A and 12B, in the embodiments shown by FIGS. 13A and 13B, the upper surface of the top electrode 256 is not flush with at least one of the upper surfaces of the first insulating cover layer 227 and the second insulating cover layer 280.

In some embodiments, the upper surface of the top electrode 256 is higher than the upper surface of the first insulating cover layer 227 and lower than the upper surface of the second insulating cover layer 280. In other words, a vertical level of an upper surface of the top electrode 256 is higher than a vertical level of an upper surface of the first insulating cover layer 227 and lower than a vertical level of an upper surface of the second insulating cover layer 280, measured from the substrate. A difference D2 between the upper surface of the top electrode 256 and the upper surface of the first insulating cover layer 227 is more than 0 nm and less than about 20 nm in some embodiments, and is more than 0 nm and less than about 10 nm in other embodiments. A difference D5 between the upper surface of the top electrode 256 and the upper surface of the second insulating cover layer 280 is more than 0 nm and less than about 15 nm in some embodiments, and is more than 0 nm and less than about 5 nm in other embodiments. Further, in some embodiments, a difference D4 between the upper surface of the first insulating cover layer 227 and the interface between the MTJ film stack 255 and the top electrode 256 is more than 10 nm in some embodiments, and is more than 20 nm in other embodiments, where D2+D4 is equal to the thickness of the top electrode 256. In other words, sidewalls of the MTJ film stack 255 is fully covered by the first insulating cover layer 227.

FIGS. 14A and 14B show various stages of a sequential manufacturing process of the semiconductor device including an MRAM according to another embodiment of the present disclosure. Material, configuration, dimensions and/or processes the same as or similar to the foregoing embodiments described with FIGS. 1A-13B may be employed in the following embodiments, and detailed explanation thereof may be omitted.

When the second insulating cover layer 280 is over-etched, the upper surface of the second insulating cover layer is located lower than at least one of the upper surface of the top electrode 226 and the upper surface of the first insulating cover layer 227.

It will be understood that not all advantages have been necessarily discussed herein, no particular advantage is required for all embodiments or examples, and other embodiments or examples may offer different advantages.

For example, in the present disclosure, by using the first and second insulating cover layers made of different materials, it is possible to selectively remove the layers, and thus to prevent damage on the MTJ film stack.

In accordance with an aspect of the present disclosure, in a method of manufacturing a semiconductor device, a magnetic random access memory (MRAM) cell structure is formed. The MRAM cell structure includes a bottom electrode, a magnetic tunnel junction (MTJ) stack and a top electrode. A first insulating cover layer is formed over the MRAM cell structure. A second insulating cover layer is formed over the first insulating cover layer. An interlayer dielectric (ILD) layer is formed. A contact opening in the ILD layer is formed, thereby exposing the second insulating cover layer. A part of the second insulating cover layer and a part of the first insulating cover layer are removed, thereby exposing the top electrode. A conductive layer is formed in the opening contacting the top electrode. In one or more of the foregoing and following embodiments, the first insulating cover layer is made of a nitride-based insulating material, and the second insulating cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the nitride-based insulating material is formed at a temperature in a range from 100° C. to 150° C. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the aluminum-based insulating material is formed at a temperature in a range from 300° C. to 450° C. In one or more of the foregoing and following embodiments, the first insulating cover layer is thicker than the second insulating cover layer. In one or more of the foregoing and following embodiments, the ILD layer includes a bottom ILD layer and a upper ILD layer, and the opening is formed by etching the upper ILD layer. In one or more of the foregoing and following embodiments, the upper ILD layer includes two or more dielectric layers. In one or more of the foregoing and following embodiments, the forming the ILD layer includes forming a dielectric material for the bottom ILD layer over the second insulating cover layer, planarizing the dielectric material to expose the second insulating cover layer, thereby forming the bottom ILD layer, and forming the two or more dielectric layers on the bottom ILD layer and the second insulating cover layer. In one or more of the foregoing and following embodiments, after the part of the second insulating cover layer and the part of the first insulating cover layer are removed, a vertical level of an upper surface of the top electrode is higher than a vertical level of an upper surface of the first insulating cover layer. In one or more of the foregoing and following embodiments, after the part of the second insulating cover layer and the part of the first insulating cover layer are removed, a vertical level of an upper surface of the second insulating cover layer is higher than the vertical level of the upper surface of the first insulating cover layer. In one or more of the foregoing and following embodiments, after the part of the second insulating cover layer and the part of the first insulating cover layer are removed, a vertical level of an upper surface of the second insulating cover layer is higher than the vertical level of the upper surface of the top electrode.

In accordance with another aspect of the present disclosure, in a method of manufacturing a semiconductor device, the semiconductor device includes a magnetic random access memory (MRAM) cell. In the method, a first conductive layer is formed over a first interlayer dielectric (ILD) layer. A stacked layer for a magnetic tunnel junction (MTJ) stack is formed over the first conductive layer. A second conductive layer is formed over the stacked layer. The second conductive layer, the stacked layer and the first conductive layer are patterned, thereby forming an MRAM cell structure including a bottom electrode formed by the first conductive layer, the magnetic tunnel junction (MTJ) stack and a top electrode formed by the second conductive layer. A first insulating cover layer is formed over the MRAM cell structure. A second insulating cover layer is formed over the first insulating cover layer. A second ILD layer is formed. A contact opening is formed in the second ILD layer, thereby exposing the second insulating cover layer. A part of the second insulating cover layer and a part of the first insulating cover layer are removed, thereby exposing the top electrode. A third conductive layer is formed in the opening contacting the top electrode. In one or more of the foregoing and following embodiments, after the patterning the second conductive layer, the stacked layer and the first conductive layer, the first ILD layer is partially recessed. In one or more of the foregoing and following embodiments, a bottom of the first insulating cover layer is located below a bottom of the bottom electrode. In one or more of the foregoing and following embodiments, the first insulating cover layer is made of SiN. In one or more of the foregoing and following embodiments, a side face of the contact opening includes a laterally etched portion. In one or more of the foregoing and following embodiments, the first insulating cover layer is formed at a temperature in a range from 100° C. to 150° C. In one or more of the foregoing and following embodiments, the second insulating cover layer is made of one or more selected from the group consisting of aluminum oxide, aluminum nitride, aluminum oxynitride, aluminum carbide and aluminum oxycarbide.

In accordance with another aspect of the present disclosure, in a method of manufacturing a semiconductor device, a magnetic random access memory (MRAM) cell structure is formed. The MRAM cell structure includes a bottom electrode, a magnetic tunnel junction (MTJ) stack and a top electrode. A first insulating cover layer is formed over the MRAM cell structure. A second insulating cover layer is formed over the first insulating cover layer. A dielectric material is formed to fully cover the second insulating cover layer. A chemical mechanical polishing operation is performed on the dielectric material to expose a part of the second insulating cover layer above the MRAM cell structure and not to expose the first insulating cover layer. An interlayer dielectric (ILD) layer is formed over the second insulating cover layer and the dielectric material. A contact opening is formed in the ILD layer, thereby exposing the second insulating cover layer. A part of the second insulating cover layer and a part of the first insulating cover layer are removed, thereby exposing the top electrode. A conductive layer is formed in the opening contacting the top electrode.

In accordance with one aspect of the present disclosure, a semiconductor device includes a magnetic random access memory (MRAM) cell. The semiconductor device includes a magnetic random access memory (MRAM) cell structure disposed over a substrate, where the MRAM cell structure includes a bottom electrode, a magnetic tunnel junction (MTJ) stack and a top electrode, a first insulating cover layer covering sidewalls of the MRAM cell structure, a second insulating cover layer disposed over the first insulating cover layer, a dielectric layer, and a conductive contact in contact with the top electrode. The first insulating cover layer is made of a nitride-based insulating material, and the second insulating cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the nitride-based insulating material is made of SiN, and the aluminum-based insulating material is one selected from the group consisting of aluminum oxide, aluminum nitride, aluminum oxynitride. In one or more of the foregoing and following embodiments, the first insulating cover layer is thicker than the second insulating cover layer. In one or more of the foregoing and following embodiments, the dielectric layer includes multiple layers, and the conductive contact passes through the multiple layers. In one or more of the foregoing and following embodiments, a vertical level of an upper surface of the top electrode from the substrate is higher than a vertical level of an upper surface of the first insulating cover layer from the substrate. In one or more of the foregoing and following embodiments, a vertical level of an upper surface of the second insulating cover layer from the substrate is higher than the vertical level of the upper surface of the first insulating cover layer. In one or more of the foregoing and following embodiments, a vertical level of an upper surface of the second insulating cover layer from the substrate is higher than the vertical level of the upper surface of the top electrode. In one or more of the foregoing and following embodiments, the MRAM cell structure has a tapered cross section having a smaller width at a top and a larger width at a bottom.

In accordance with another aspect of the present disclosure, a semiconductor device includes a magnetic random access memory (MRAM) cell. The semiconductor device includes magnetic random access memory (MRAM) cell structures disposed over a substrate, where each of the MRAM cell structure includes a bottom electrode, a magnetic tunnel junction (MTJ) stack and a top electrode, a first insulating cover layer covering sidewalls of each of the MRAM cell structures, a second insulating cover layer disposed over the first insulating cover layer, a bottom dielectric layer filling a space between adjacent MRAM cell structures, an upper dielectric layer disposed over the bottom dielectric layer, and a conductive contact in contact with the top electrode of each of the MRAM cell structures. The first insulating cover layer is made of a nitride-based insulating material, and the second insulating cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the aluminum-based insulating material is one or more selected from the group consisting of one or more selected from the group consisting of aluminum oxide, aluminum nitride, aluminum oxynitride. In one or more of the foregoing and following embodiments, the first insulating cover layer is thicker than the second insulating cover layer. In one or more of the foregoing and following embodiments, the upper dielectric layer includes multiple layers, and the conductive contact passes through the multiple layers. In one or more of the foregoing and following embodiments, a vertical level of an upper surface of the top electrode from the substrate is higher than a vertical level of an upper surface of the first insulating cover layer from the substrate. In one or more of the foregoing and following embodiments, a vertical level of an upper surface of the second insulating cover layer from the substrate is higher than the vertical level of the upper surface of the first insulating cover layer. In one or more of the foregoing and following embodiments, a vertical level of an upper surface of the second insulating cover layer from the substrate is higher than the vertical level of the upper surface of the top electrode. In one or more of the foregoing and following embodiments, each of the MRAM cell structures has a tapered cross section having a smaller width at a top and a larger width at a bottom.

In accordance with another aspect of the present disclosure, a semiconductor device includes a magnetic random access memory (MRAM) cell. The semiconductor device includes a first interlayer dielectric (ILD) layer disposed over a substrate, a via contact disposed in the first ILD layer, a magnetic random access memory (MRAM) cell structure in contact with the via contact, where the MRAM cell structure includes a bottom electrode, a magnetic tunnel junction (MTJ) stack and a top electrode, a first insulating cover layer covering sidewalls of the MRAM cell structure, a second insulating cover layer disposed over the first insulating cover layer, a dielectric layer, and a conductive contact in contact with the top electrode. The first insulating cover layer is made of a nitride-based insulating material, and the second insulating cover layer is made of an aluminum-based insulating material different from the nitride-based insulating material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming a magnetic random access memory (MRAM) cell structure including a bottom electrode, a magnetic tunnel junction (MTJ) stack and a top electrode;
forming a first dielectric layer over the MRAM cell structure;
forming a lower interlayer dielectric (ILD) layer over the first insulating layer;
performing a planarization operation on the lower ILD layer to expose the first insulating layer without exposing an underlying layer below the first insulating layer;
forming an upper ILD layer on the planarized lower ILD layer and the exposed first insulating layer;
forming a contact opening in the upper ILD layer, thereby exposing the first insulating layer;
removing at least a part of the first insulating layer, thereby exposing the top electrode within the contact opening; and
forming a conductive layer in the contact opening contacting the top electrode, wherein:
the first insulating layer is made of one or more selected from the group consisting of aluminum carbide and aluminum oxycarbide.

2. The method of claim 1, further comprising:
before the first insulating layer is formed, forming a second insulating layer over the MRAM cell structure to cover side faces of the bottom electrode, the MTJ stack and the top electrode and a top face of the top electrode,
wherein the second insulating layer is made of a nitride-based insulating material.

3. The method of claim 2, wherein the nitride-based insulating material is one or more selected from the group consisting of SiN, SiON and SiOCN.

4. The method of claim 3 wherein the nitride-based insulating material is formed by CVD or ALD at a temperature in a range from 100° C. to 150° C.

5. The method of claim 3, wherein the second insulating layer is thicker than the first insulating layer.

6. The method of claim 2, wherein the first insulating layer is formed at a temperature in a range from 300° C. to 450° C.

7. The method of claim 2, wherein:
the upper ILD layer includes a first dielectric layer, a second dielectric layer on the first dielectric layer and a third dielectric layer on the second dielectric layer,
the first dielectric layer, the second dielectric layer and the third dielectric layer are made of different materials from each other, and
one of the first or second dielectric layers includes SiC, SiCN or SiOCN.

8. The method of claim 7, wherein a thickness of the third dielectric layer is greater than a thickness of the first dielectric layer and a thickness of the second dielectric layer.

9. The method of claim 7, wherein the third dielectric layer includes a low-k dielectric material.

10. The method of claim 7, wherein during the contact opening is formed, one of the lower ILD layer or the first dielectric layer is laterally etched.

11. A semiconductor device including a magnetic random access memory (MRAM) cell, comprising:
a magnetic random access memory (MRAM) cell structure disposed over a substrate, the MRAM cell structure including a bottom electrode, a magnetic tunnel junction (MTJ) stack and a top electrode;
a first insulating layer disposed over the MRAM cell structure;
a first interlayer dielectric (ILD) layer disposed over the first insulating layer;
a second ILD layer disposed over the first ILD layer; and
a conductive contact in contact with the top electrode,
wherein the first insulating layer is made of one or more selected from the group consisting of aluminum carbide and aluminum oxycarbide.

12. The semiconductor device of claim 11, further comprising a second insulting layer made of a nitride-based insulating material,
wherein the insulating layer covers sidewalls of the MRAM cell structure.

13. The semiconductor device of claim 12, wherein the nitride-based insulating material is one or more selected from the group consisting of SiON and SiOCN.

14. The semiconductor device of claim 12, wherein the first insulting layer is thinner than the second insulting layer.

15. The semiconductor device of claim 12, wherein the nitride-based insulating material is SiON.

16. The semiconductor device of claim 12, wherein:
the second ILD layer includes a first dielectric layer, a second dielectric layer on the first dielectric layer and a third dielectric layer on the second dielectric layer,
the first dielectric layer, the second dielectric layer and the third dielectric layer are made of different materials from each other, and
one of the first or second dielectric layers includes SiC, SiCN or SiOCN, and
the conductive contact passes through the first, second and third dielectric layers.

17. A semiconductor device including a magnetic random access memory (MRAM) cell, comprising:
magnetic random access memory (MRAM) cell structures disposed over a substrate, each of the MRAM cell structure including a bottom electrode, a magnetic tunnel junction (MTJ) stack and a top electrode;
a first insulating layer disposed over each of the MRAM cell structures;
a first interlayer dielectric (ILD) layer filling a space between adjacent MRAM cell structures;
a second ILD layer disposed over the first ILD layer; and
a conductive contact in contact with the top electrode of each of the MRAM cell structures, wherein:
the first insulating layer is made of one or more selected from the group consisting of aluminum oxide, aluminum carbide and aluminum oxycarbide, and
a concentration of at least one of Al, O, or C in the first insulating layer in a thickness direction is not uniform.

18. The semiconductor device of claim 17, further comprising a second insulting layer including one of SiON or SiOCN,
wherein the insulating layer covers sidewalls of the MRAM cell structure.

19. The semiconductor device of claim 18, wherein:
the second ILD layer includes a first dielectric layer, a second dielectric layer on the first dielectric layer and a third dielectric layer on the second dielectric layer,
the first dielectric layer, the second dielectric layer and the third dielectric layer are made of different materials from each other, and
the conductive contact includes a lateral protrusion laterally protruding into one of the first ILD layer or the first dielectric layer.

20. The semiconductor device of claim 19, wherein:
one of the first or second dielectric layers includes SiC, SiCN or SiOCN, and the third dielectric layer includes a low-k dielectric material.

* * * * *